United States Patent [19]

Eytcheson et al.

[11] Patent Number: 4,490,902

[45] Date of Patent: Jan. 1, 1985

[54] LEAD FRAME FOR MOLDED INTEGRATED CIRCUIT PACKAGE

[75] Inventors: Charles T. Eytcheson; Phillip A. Lutz; Harold L. Fields, all of Kokomo, Ind.

[73] Assignee: General Motors Corporation, Detroit, Mich.

[21] Appl. No.: 414,792

[22] Filed: Sep. 3, 1982

[51] Int. Cl.³ .................. H01L 23/28; H01L 23/48
[52] U.S. Cl. ........................................ 29/588; 29/589; 29/827; 357/70; 357/72; 264/272.11
[58] Field of Search ............... 29/577 R, 527, 588, 29/589, 827, 838, 855, 841; 148/1.5; 357/70, 74, 80, 72; 264/272.11-272.15

[56] References Cited

U.S. PATENT DOCUMENTS

| | | | |
|---|---|---|---|
| 3,574,815 | 4/1971 | Segerson | 264/269 |
| 3,611,061 | 10/1971 | Segerson | 174/52 PE |
| 4,109,096 | 8/1978 | Dehaine | 174/68.5 |
| 4,214,364 | 7/1980 | St. Louis et al. | 29/587 X |
| 4,234,666 | 11/1980 | Gursky | 428/573 |
| 4,301,464 | 11/1981 | Otsuki et al. | 357/70 |
| 4,374,080 | 2/1983 | Schroeder | 264/272.11 |
| 4,449,690 | 5/1984 | Schroeder | 249/110 |

Primary Examiner—Brian E. Hearn
Assistant Examiner—David A. Hey
Attorney, Agent, or Firm—Robert J. Wallace

[57] ABSTRACT

A lead frame for a molded semiconductor device package. The lead frame has a pattern of finger leads with convergent free inner ends and dam bars between adjacent finger leads. The dam bars are partially severed from their contiguous finger leads due to cuts on their edges intended to face a body member molded over the finger lead inner ends. The partially severed dam bar edge is preferably positioned to be substantially at the periphery of the molded body member. The resultant molded body member can thus have a finished surface even between the finger leads as molded and dam bar cutting die wear reduced.

2 Claims, 9 Drawing Figures

LEAD FRAME FOR MOLDED INTEGRATED CIRCUIT PACKAGE

FIELD OF THE INVENTION

This invention relates to manufacturing semiconductor devices. It more particularly relates to an improved dam bar on a lead frame for a molded semiconductor device package.

BACKGROUND OF THE INVENTION

It is customary to use dam bars on lead frames for molded semiconductor device packages, particularly integrated circuit packages. The dam bars are used to simplify sealing of the package mold on the various finger leads of the frame. The mold is sealed by simply clamping opposed flat faces of the mold onto the dam bar area of the lead frame. The dam bars thus prevent leakage of molding compound out of the die cavity along the fingers of the lead frame. They also provide lateral support for the finger leads during molding. After molding, the dam bars are cut away from their contiguous finger leads to provide discrete finger leads on the molded package.

The molding compound used for these packages is normally rather abrasive in character. For example, a typically used plastic molding composition ordinarily contains 50% or more of an abrasive type of filler such as silicon dioxide, talc, etc. If the dam bars of prior lead frames are spaced too close to the molded package, their cutting die may scrape the edge of the molded package, and become dull. As a result, it is customary to space the dam bars slightly away from the molded package. On the other hand, spacing the dam bars away from the package generates another problem. The spaced dam bars allow a thin web of molding compound to form between the finger leads. This web is popularly referred to as a flash or fin. When the dam bars are cut away the cutting die contacts the web. In addition, portions of the web fall into the cutting die assembly, to eventually accumulate and cause accelerated cutting die wear. In addition, the web may not be completely uniformly removed from the package edge when the dam bars are cut. It may be necessary to complete their removal in a subsequent finishing operation, which adds a step and further cost to package manufacture.

The final removal of the web is most conveniently done under high volume production conditions in a manner that does not produce a smooth surface on the package when the web was removed. There is belief by some that the unfinished edge on the package, where the web was broken away, provides a site where impurities, moisture, and the like, can possibly enter the package and degrade it. There may be no merit to this belief. Nonetheless, it is generally conceded that a smooth finished surface over all of the package is desirable if it can be conveniently produced. We have now discovered a new lead frame configuration that permits one to avoid forming the web without generating the aforementioned dam bar cutting die problems. Hence, if desired, a finished surface can be conveniently produced on the package body even between the finger leads.

OBJECTS AND SUMMARY OF THE INVENTION

It is, therefore, an object of this invention to provide an improved lead frame for a molded semiconductor device package.

Another object of the invention is to provide an improved semiconductor device package.

A further object of the invention is to provide an improved method of molding an integrated circuit package, which method can provide reduced dam bar cutting die wear and improved surface finish on the molded body of the package.

The invention comprehends making a semiconductor device molded package from a lead frame having an improved dam bar between finger leads. In its preferred embodiment the dam bar has an inner edge positioned at the outer periphery of the molded package. Before the package is molded to the lead frame, each dam bar is partially severed from both of its contiguous finger leads. The partial severing is performed by making a cut part-way along each finger lead, starting with the dam bar inner edge. The dam bar cutting die need thus only shear the remainder of the dam bar on its outer edge after package molding.

BRIEF DESCRIPTION OF THE DRAWING

Other objects, features and advantages of the invention will become more apparent from the following description of preferred embodiments thereof and from the drawing, in which.

DESCRIPTION OF THE PREFERRED EMBODIMENTS

Figure 1:
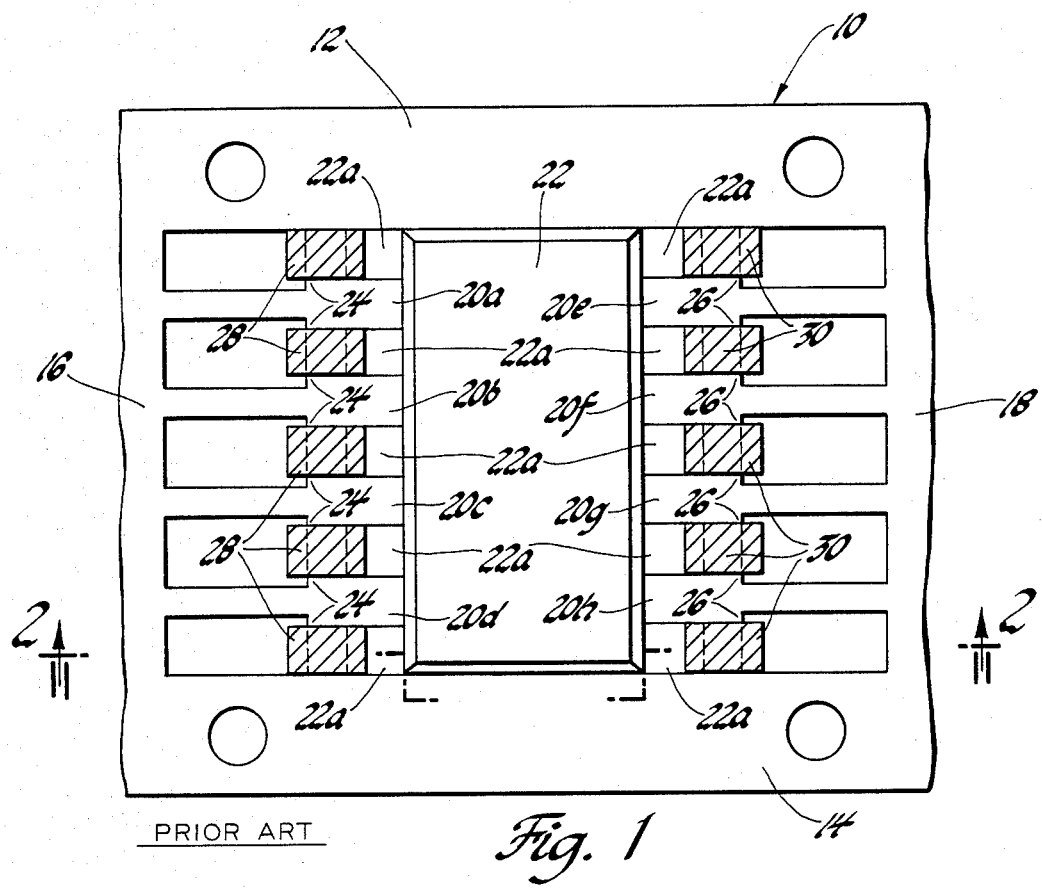
FIG. 1 shows an elevational view of a prior art lead frame and molded package, with overlying dam bar cutting die punches shown in cross section.
Figure 2:
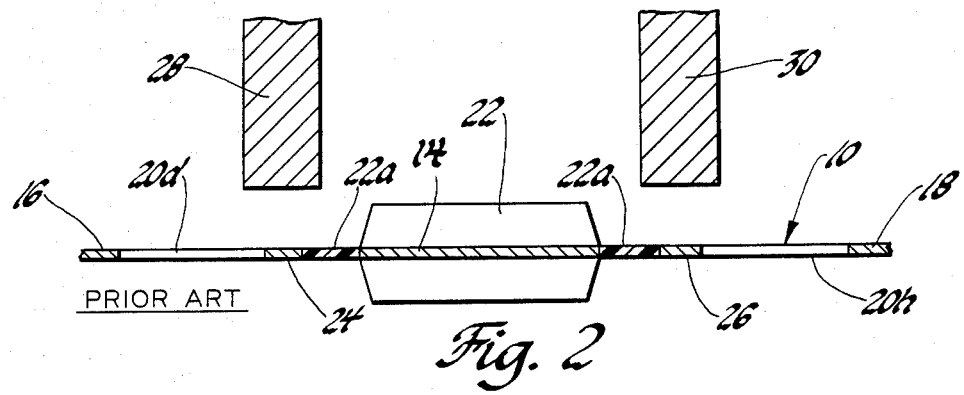
FIG. 2 shows a cross-sectional view along the line 2—2 of FIG. 1 before dam bars are cut away.
Figure 3:
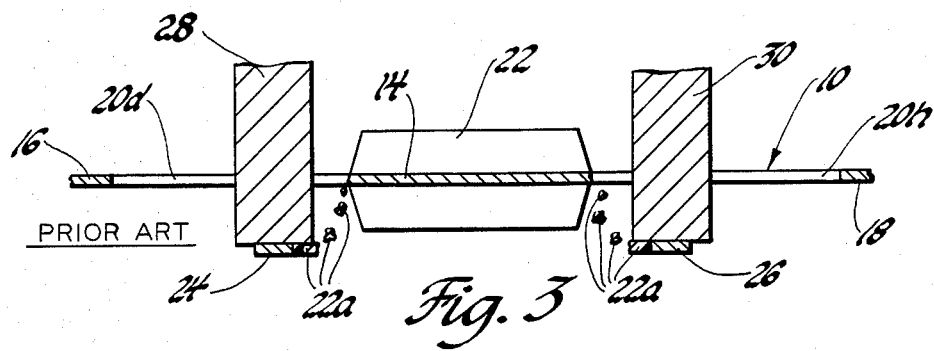
FIG. 3 shows a cross-sectional view along the line 3—3 of FIG. 1 while dam bars are being cut away.
Figure 4:
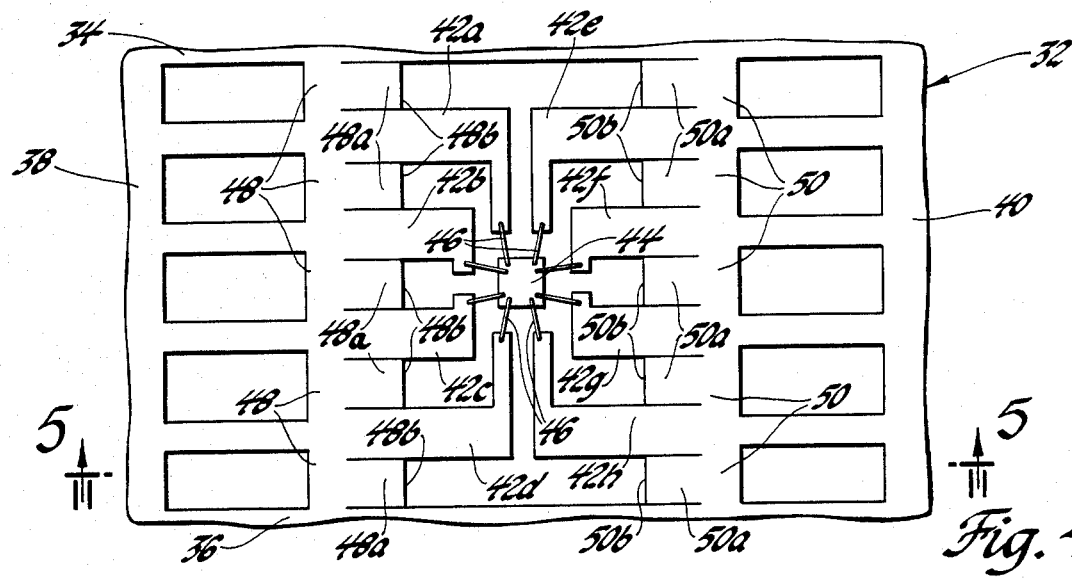
FIG. 4 shows a plan view of an integrated lead frame made in accordance with this invention.

Reference is now made to FIGS. 1-3, which represent a sample of prior art. FIGS. 1-3 show a sheet-like metal lead frame, designated by the general reference character 10. This lead frame is usually entirely of metal and can be a composite of different metals. Lead frame 10 includes two parallel side rails 12 and 14 between which is disposed a repetitive pattern of convergent finger leads. Only one example of the pattern is shown. Each pattern of finger leads on the lead frame 10 is separated from the adjacent patterns by transverse bar portions 16 and 18, only a portion of which is shown. The lead frame being a sheet, is generally most conveniently formed by punching or the like. Finger leads 20a–20d comprise a first line of parallel finger leads, that have convergent free ends connected to a semiconductor chip (not shown) embedded within an injection molded plastic block, i.e. package body member 22. Analogously, finger leads 20e–20h form a second line of finger leads, that have convergent free ends connected to the same semiconductor chip previously referred to (not shown) embedded within the plastic block 22. Plastic block 22 in combination with the two lines of leads 20a–20d and 20e–20h comprise a dual-in-line package (DIP).

To provide a ready seal around finger leads 20a–20h when molding plastic block 22 and also to laterally support the finger leads during molding, the finger leads are not completely separated from each other and the balance of the lead frame 10 before molding. For example, finger leads 20a–20d are interconnected to each other and to the side rails by means of dam bars 24. Analogously, finger leads 20e–20h are interconnected to each other and to the side rails 12 and 14 by means of dam bar elements 26. Punches 28 and 30 from a cutting die (not shown) respectively overlie the dam bars 24 and 26.

After molding and before the dam bars 24 and 26 are removed, plastic molding composition forming block 22 extends out from the plastic block 22 as a web 22a between the finger leads and side rails 12 and 14 up to the dam bars 24 and 26. The web is as thick as the dam bars and finger leads, i.e. the lead frame sheet 10. When the dam bars 24 and 26 are later severed from the lead frame 10 by means of the punches 28 and 30, the webs 22a are also coincidentally broken away at least partially from the main body of the package. Fragments of webs 22a are thus concurrently deposited in the dam bar cutting die assembly where it can accumulate and cause cutting die wear. In addition, the breakage of webs 22a leaves a rough surface on plastic block 22 between the finger leads 20a–20h. This rough surface is believed by some to pose a site for entrance of contaminants, at least moisture, into plastic block 22, and thence to the semiconductor chip enclosed within it. While there may be no conclusive data to support such a contention, it is much preferred to produce block 22 with as finished a surface as possible, as molded.

The particles of the broken webs 22a accumulating within the cutting die assembly present a cutting die wear problem because the molding composition which forms block 22 has an abrasive filler. This filler causes excessive wear on punches 28 and 30, and their corresponding anvil edges (not shown). Spacing the dam bars closer to body 22 to avoid forming the webs presents other problems, as previously mentioned.

The lead frame of our invention can be seen in FIGS. 4–9, where it is referred to generally by reference numeral 32. As is customary our lead frame is a metal sheet patterned by punching or the like. Sheet 10 can be composed of the same single metal or laminate, and be of the same thickness one would customarily use in making the prior art lead frames. No difference is required in order to employ this invention. Also, as is customary, our lead frame includes side rail portions 34 and 36 and transverse bar portions 38 and 40 (only partly shown) which separate a repetitive pattern of convergent finger leads in the lead frame. As with the prior art lead frame, only one example of the pattern is shown and the finger leads of the pattern are arranged in two rows. The first row of finger leads is referred to by reference numerals 42a–42d. The second line of finger leads is referred to by reference numerals 42e–42h. Each of the finger leads 42a–42h have inner free ends that are electrically connected to appropriate contact pads (not shown) on a semiconductor integrated circuit device chip 44 by means of filamentary wires 46. While the filamentary wires are our preferred example, it should be understood that the semiconductor die could be connected to the finger lead free ends by other means, as for example by flip chip or beam lead techniques. The semiconductor integrated circuit chip 44 can be of any circuit or device, and more finger leads than shown might be used, especially if the integrated circuit of chip 44 is complex.

Dam bars 48 are provided between the finger leads 42a–42d and the side rails 34 and 36. Similarly, dam bars 50 are provided between the finger leads 42e–42h and the side rails 34 and 36. By reference to FIGS. 1–3, one can see that the dam bars 48 and 50 of this invention are significantly wider than the dam bars 24 and 26 of the prior art. In fact, they are about twice as wide as they are long. The prior art dam bars are longer than they are wide.

In addition, the dam bars 48 and 50 are partially cut from the lead frame before a package is molded to the lead frame. The partial cuts start with the dam bar inner edges 48b and 50b and extend along each finger lead for a distance that is over half the width of the dam bars. This distance can, in fact, vary, depending on the tolerances available with any given part, molding equipment, and cutting dies. It ordinarily would be at least one-third the width of the dam bars. In substance, the dam bars have to be cut far enough to provide adequate clearance when they are cut completely away after molding. Since the finger lead spacing in the lead frame is ordinarily as close as manufacturing tolerances practically allow, it may be appropriate to also use a generally similar separation between the dam bar cutting die punches and the body molded to the lead frame. In other words, we would prefer to cut dam bars 48 and 50 at least as far back from edges 48b and 50b as the spacing between finger leads, i.e. the length of edges 48b and 50b. How much uncut dam bar width is necessary to support the lead frame fingers 42a–42h will be a function, of course, of the molding equipment used, the strength of the lead frame materials used, the rigors of the molding operation, etc.

Figure 5:
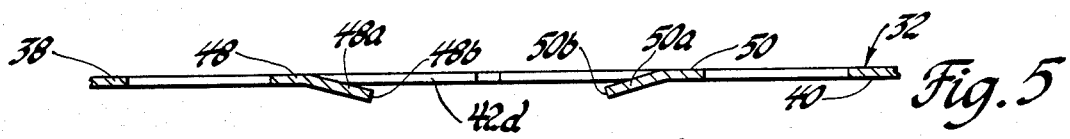
FIG. 5 shows the sectional view along the line 5—5 of FIG. 4 immediately after partial severing of dam bars.
Figure 6:
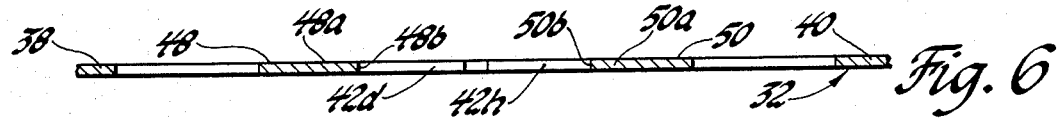
FIG. 6 shows a sectional view of the FIG. 5 device after partially severed dam bars are moved back into the planes of the lead frame.

Referring now to FIG. 5, the innermost portions 48a and 50a of the dam bars 48 and 50 are most conveniently cut away from their contiguous finger leads and side rails in a shearing step that pushes dam bar portions 48a and 48b completely out of the planes occupied by the thickness of the lead frame 32. Dam bar portions 48a and 50a can be sheared during the punching operation which forms the pattern of the lead frame 32, or it can be done in a subsequent operation. In order for dam bar portions 48a and 50a to perform their desired function as dam bars, they must be pressed back into the planes defining lead frame 32, as shown in FIG. 6. It should also be noted that the shearing operation does not leave much of a kerf along the sheared edges of the lead frame. Consequently, the cut edges nest together in a close fitting relationship when they are pressed back into place as shown in FIG. 6. Hence, there is little or no space between the cut edges of dam bar portions 48a and 50a and their contiguous finger lead and side rails edges for molding material to creep between during molding. Thus, the damming function is confined predominantly to edges 48b and 50b.

It should also be noted that the dam bar inner edges 48b and 50b are positioned on lead frame 32 to be substantially coterminous with the mold cavity (not shown) which is used to subsequently form the plastic block 52 over the inner ends of the finger leads 42a–42h and the semiconductor die 44. The inner edges 48b and 50b will be so positioned when in the mold by appropriately positioning lead frame 32 in the mold while lead frame 32 is as shown in FIG. 6. When lead frame 32 is placed in the molding die, dam bars 48 and 50 clamp between opposed faces of the molding die that surround the mold cavity. The molding die can clamp anywhere along the width of the dam bars 48 and 50 starting with the inner edges 48b and 50b. A wide clamping area is provided, if one wants to use it.

Figure 7:
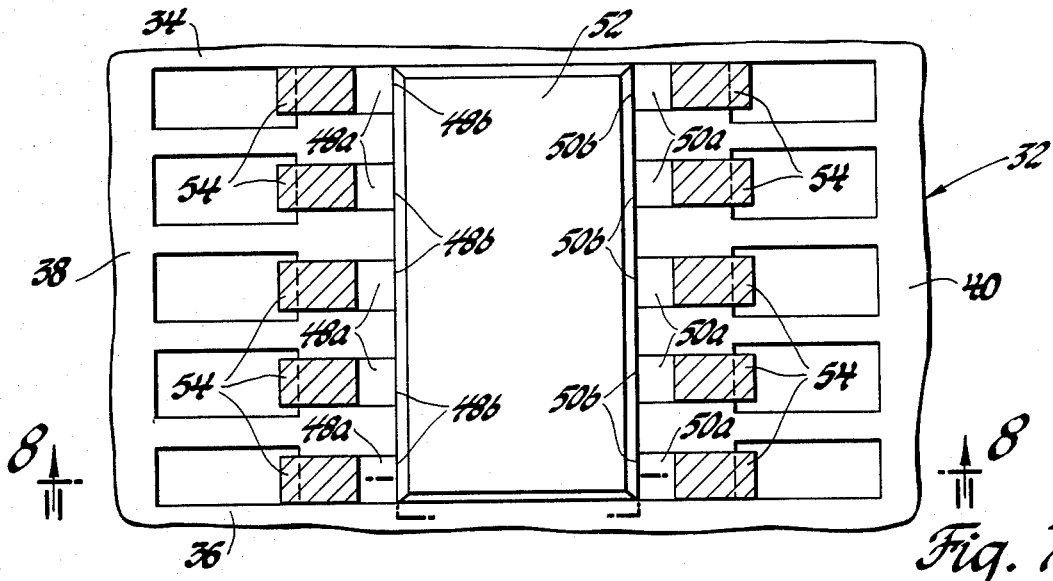
FIG. 7 shows a plan view of the lead frame of FIG. 6 after molding of a body member thereon, with overlying dam bar cutting die punches shown in cross section.
Figure 8:
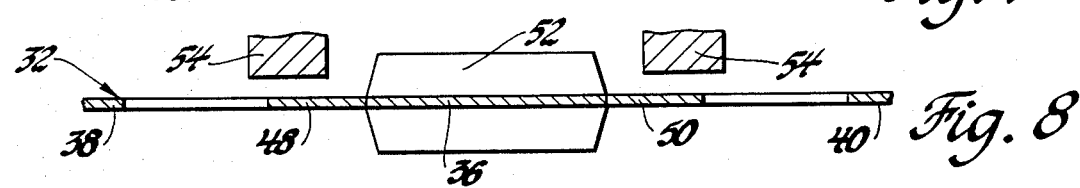
FIG. 8 shows a sectional view along the line 8—8 of FIG. 7 before dam bars are cut away.
Figure 9:
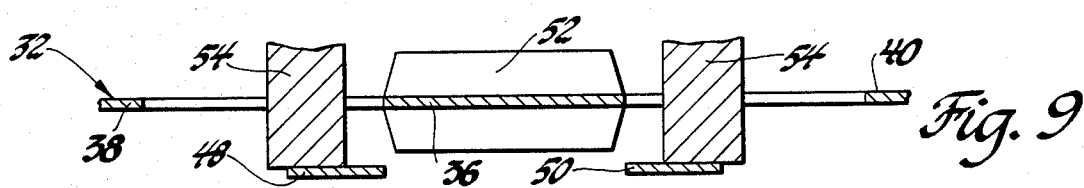
FIG. 9 shows a sectional view along the line 8—8 of FIG. 7 while dam bars are being cut away.

Referring now to FIGS. 7–9, one can see that the periphery of the plastic block 52 is coterminous with inner edges 48b and 50b of the dam bars. Consequently, no web of body molding material forms between the lead frame finger leads and the side rails. Flash may occur on the upper and lower surfaces of the finger leads, as might occur in prior art lead frames. However, there is no flash, i.e. web, produced between the finger leads. If the flash above and below the leads is extensive, the package may have to be treated to remove it, as is customary. Such a final finishing operation would be needed when one uses a prior art lead frame in a given situation. He would still probably have to use it when one uses the lead frame of this invention.

On the other hand, it can be noted by comparing FIGS. 2 and 3 with FIGS. 8 and 9, that in this invention no web need be molded between the finger leads when using this invention. The volume that the web previously occupied is filled by the dam bar cut portions 48a and 50a. Thus, when the punches 54 cut the remaining portions of the dam bars 48 and 50 away from the lead frame 32, there is no significant web of molding material to fall into the cutting die assembly, where it can accumulate and dull the cutting surfaces on the punches 54 and their associated anvil edges (not shown). FIG. 9 shows the dam bars 48 and 50 as being cut away. It is clearly seen here that in our preferred embodiment there is no plastic web that is involved.

Still further, the extent of cut portions 48a and 50a will vary depending upon the tolerance needed for any particular cutting die assembly between the punches 54 and the plastic block 52. One does not want the punches 54 to accidentally strike the plastic block 52, or the cutting edges of the cutting die assembly will become dull. Accordingly, the spacing can vary depending upon the tolerances required for the particular cutting die assembly which is used.

It should be recognized that the portions 48a and 48b can also be formed by other techniques. Depending upon how the portions 48a and 50a are formed, i.e. separated from their contiguous finger leads and side rails, there may be a wider kerf or gap resulting between them and their contiguous finger leads and side rails. The shearing operation which we prefer to use to form portions 48a and 50b, wherein they can be pressed back into place, seems to provide the most effective way of producing the separation without also producing any significant gap or kerf between the portions 48a and 50b and their contiguous finger leads and side rails. Nonetheless, even if there is some sort of gap, the amount of web formed between the finger leads during molding is still reduced, as it would even if edges 48b and 50b were not made to be coterminous with the mold cavity. This, of course, would reduce the accumulation of molding material in the cutting dies and, therefore, reduce cutting die wear. However, in its most preferred form the portions 48a and 50a are closely fitted between the finger leads and the side rails so as to minimize any creep of molding material therearound during injection molding. Analogously, edges 48b and 50b are positioned so as to not form a depression or projection on the plastic block 52.

The embodiments of the invention in which an exclusive property or privilege is claimed are defined as follows:

1. A method of making a semiconductor device package that includes molding a plastic body member over a semiconductor die affixed to inner free ends of a convergent pattern of finger leads of a sheet-like lead frame, the lead frame having integral dam bars transversely connecting finger leads, the improvement of providing a lead frame in which each dam bar has a cut made before the molding operation between each end and a contiguous finger lead extending from an inner facing edge of the dam bar toward but not reaching the opposite dam bar edge, positioning the lead frame in a mold having a package body molding cavity periphery adjacent the dam bar inner facing edge to minimize flash between finger leads during molding, clamping the dam bars between opposed faces on the mold, molding a package body within the cavity without producing a significant web between finger leads, and cutting the balance of each dam bar from each finger lead without encountering excessive cutting die wear due to contact with abrasive body molding material.

2. A method of making a semiconductor device package that includes molding a plastic body member around a semiconductor die and its connected inner free ends of a convergent finger lead pattern on a sheet-like lead frame, the lead frame having integral dam bars transversely connecting finger leads, the improvement of providing a lead frame in which each dam bar is partially severed before the molding operation from each of its contiguous finger leads starting from a mold cavity-facing edge on the dam bar for a distance at least about one-third the dam bar inner and opposite edge spacing, the dam bar inner edge is not more than about one-half the aforementioned dam bar edge spacing and is located to be substantially congruent with a mold cavity for molding the plastic body member, positioning the lead frame in a mold with the dam bar inner edges located substantially at the periphery of a body cavity, clamping lead frame dam bars between opposed faces of the mold, injecting a plastic molding composition into the body cavity effective to mold the body member without concurrently producing any significant plastic fin between the finger leads, and cutting the dam bars completely away from the finger leads without depositing fin molding composition into the cutting die assembly and causing excessive cutting die wear, effective to produce an as-molded body on the package that can be used without any special surface finishing selective to body surface areas between the finger leads.

* * * * *